(12) United States Patent
Tien et al.

(10) Patent No.: US 7,998,772 B2
(45) Date of Patent: Aug. 16, 2011

(54) METHOD TO REDUCE LEAKAGE IN A PROTECTION DIODE STRUCTURE

(75) Inventors: Bor-Zen Tien, Hsinchu (TW); Tzong-Sheng Chang, Hsinchu (TW); Yung-Fu Shen, Tainan (TW); Jieh-Ting Chang, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 12/592,810

(22) Filed: Dec. 3, 2009

(65) Prior Publication Data

US 2010/0081249 A1    Apr. 1, 2010

Related U.S. Application Data

(62) Division of application No. 11/044,819, filed on Jan. 26, 2005, now Pat. No. 7,663,164.

(51) Int. Cl.
*H01L 21/00* (2006.01)

(52) U.S. Cl. ............ 438/42; 438/48; 438/282; 438/424; 438/426; 438/910; 257/E21.545

(58) Field of Classification Search ............ 438/581, 438/583, 942, 944, 42, 48, 282, 424, 426, 438/910
See application file for complete search history.

(56) References Cited

U.S. PATENT DOCUMENTS

| | | | |
|---|---|---|---|
| 5,629,544 A | 5/1997 | Voldman et al. | |
| 6,093,593 A | 7/2000 | Jang | |
| 6,277,723 B1 | 8/2001 | Shih et al. | |
| 6,291,281 B1 | 9/2001 | Wang et al. | |
| 6,294,448 B1 | 9/2001 | Chang et al. | |
| 6,507,090 B1 | 1/2003 | Hu et al. | |
| 2003/0205774 A1* | 11/2003 | Hokazono | 257/486 |
| 2004/0080883 A1* | 4/2004 | Chatterjee et al. | 361/56 |
| 2005/0106833 A1* | 5/2005 | Oyamatsu et al. | 438/400 |

OTHER PUBLICATIONS

VLSI Technology, 1983, p. 456, McGraw-Hill, U.S.
ULSI Technology, International Editions 1996, p. 396, The McGraw-Hill Companies, Inc., Singapore.

* cited by examiner

*Primary Examiner* — Wai-Sing Louie
(74) *Attorney, Agent, or Firm* — Duane Morris LLP

(57) ABSTRACT

A method for forming a protection diode utilizes processing operations and materials used in the formation of the CMOS integrated circuit device and provides a protection diode used in CMOS integrated circuit devices to direct charged particles to benign locations and prevent damage to the devices. The protection diode includes a well region of a first conductivity type formed in a surface of a semiconductor substrate, a heavily doped P-type impurity region disposed within the well region, a heavily doped N-type impurity region disposed within the well region and an STI structure interposed therebetween. A top surface of the STI structure extends above the surface. A silicide resistant block-out layer is formed over the STI structure and extends laterally beyond the STI structure, covering any counterdoped sections that may undesirably be formed in the substrate adjacent the STI structure during implantation operations.

14 Claims, 4 Drawing Sheets

US 7,998,772 B2

METHOD TO REDUCE LEAKAGE IN A PROTECTION DIODE STRUCTURE

RELATED APPLICATION

This application is a divisional application of U.S. patent application Ser. No. 11/044,819, filed on Jan. 26, 2005, now U.S. Pat. No. 7,663,164 the contents of which are hereby incorporated by reference as if set forth in their entirety.

FIELD OF THE INVENTION

The present invention relates to methods used to fabricate semiconductor devices, and more specifically to methods used to form an improved protection diode device that protects complimentary metal oxide semiconductor (CMOS) devices from being damaged during their fabrication.

BACKGROUND OF THE INVENTION

During the fabrication of CMOS devices, various processing steps such as plasma deposition and plasma etching can deleteriously influence underlying components of uncompleted CMOS devices. Charged particles, generated during such plasma procedures, can damage the already formed thin gate insulator layers used for the CMOS devices, for example. Protection devices such as protection diodes can be used to guide the unwanted currents generated by the plasma procedures to benign locations in the semiconductor substrate, thus not adversely affecting CMOS device yield or performance.

It is advantageous to form the protection device at an early stage of the CMOS device fabrication sequence so that they are in place during as many of the subsequent plasma processes as possible. Subsequent processing steps such as the formation of heavily doped source/drain regions can counter-dope unprotected regions of a protection device such as a diode which, when overlaid with a conductive layer such as metal silicide, can result in unwanted leakage of the protection device, thus reducing or eliminating the ability of the protection device to protect the sensitive components of CMOS devices.

Fringe type protection diode structures include a doped portion formed in regions of a semiconductor substrate surrounded by shallow trench isolation (STI) regions, and are particularly vulnerable to counterdoping phenomena during the subsequent source/drain formation procedures that involve heavy doping. The topography at the interface between the STI, which extends above the substrate surface, and the protection device, formed in the substrate surface, can present problems when attempting to completely cover the protection diode device with a photoresist shape for blocking-out subsequently implanted species used in the formation of heavily doped CMOS source/drain regions, for example. The photoresist shape can become notched, or thinned at this topographical interface allowing unwanted species to enter the peripheral regions of the protection diode device near the interface. If the undesirably implanted species is of opposite conductivity (i.e., counterdoping occurs) a subsequent metal silicide contact layer formed to overlay both the main doped portion of the protective diode, and the oppositely doped component at the periphery, provides a direct path through the protection diode device to regions of the semiconductor substrate, negating the purpose of the protection diode.

The present invention advantageously provides a structure and procedure whereby the protection diode structure, even if undesirably counterdoped during subsequent implant procedures, still remains effective after formation of an overlying metal silicide layer, and therefore still functions to direct any unwanted charge generated during subsequent plasma procedures, to non-CMOS regions of the semiconductor substrate. This is accomplished via masking procedures obtained using no additional process or masking steps. References such as Voldman et al, in U.S. Pat. No. 5,629,544, Chang et al., in U.S. Pat. No. 6,294,448, Wang et al., in U.S. Pat. No. 6,291,281 and Jang, in U.S. Pat. No. 6,093,593, describe methods of forming protective structures, or describe materials used to avoid leakage paths through protection diode devices, but fail to provide a structure that effectively prevents an overlying conductive layer, such as metal silicide, from shorting the counterdoped region of the protection diode structure to an underlying well region. The present invention addresses this shortcoming of conventional technology.

SUMMARY OF THE INVENTION

To address these and other needs and in view of its purposes, an aspect of the present invention provides a method for forming a protection diode device in a semiconductor substrate. The method includes forming a well region of a first conductivity type in a top portion of a semiconductor substrate and forming at least an insulator filled shallow trench isolation (STI) structure in the well region. The STI structure extends above a surface of the semiconductor substrate. The method further provides forming a heavily doped region of a second conductivity type in a top portion of the well region, forming a block-out structure over the STI structure and over an adjacent portion of the heavily doped region of a second conductivity type adjacent the STI structure, but not over an uncovered central portion of the heavily doped region of a second conductivity type, and selectively forming a metal silicide layer on the uncovered central portion of the heavily doped region.

Another aspect of the present invention provides a protection diode in a semiconductor device. The protection diode comprises a well region of a first conductivity type formed in a surface of a semiconductor substrate, a heavily doped P-type impurity region disposed within the well region, a heavily doped N-type impurity region disposed within the well region and an STI structure interposed therebetween, a top surface of the STI structure extending above the surface; and a silicide resistant block-out layer formed over the STI structure and extending laterally beyond the STI structure.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION OF THE INVENTION

An aspect of the invention provides a method for forming a protection diode device that can be effectively used to guide unwanted currents generated during processing operations used to form the semiconductor device, to benign locations in the semiconductor substrate. The protection device includes an insulating layer used to protect peripheral portions of heavily doped components of the protection device that may become counterdoped during processing operations. The insulating layer prevents the formation of the silicide layer and prevents the counterdoped region from shorting to the substrate using the applied voltages under which the semiconductor device operates. In the following description, the invention will be described with respect to a $N^+/P$ diode formed in a P-well region of a semiconductor substrate and used for protection of N-channel or NMOS type devices but it should be understood that the invention is equally applicable to $P^+/N$ diodes, formed in N-well regions of a semiconductor substrate and used for the protection of P-channel or PMOS type devices.

Figure 1A:
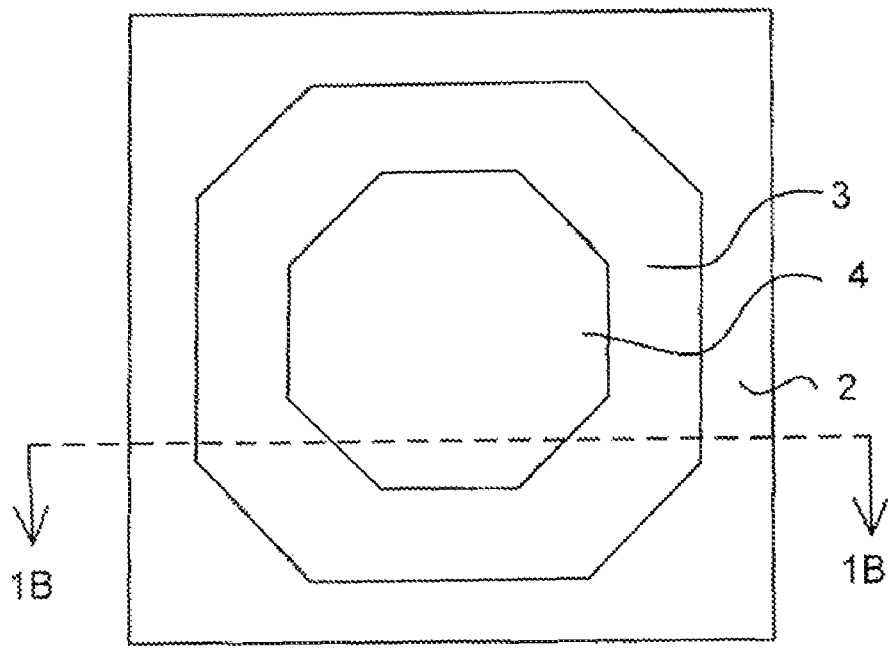
FIGS. 1A and 2A schematically show top views of an exemplary protection diode device at various fabrication stages.
Figure 1B:
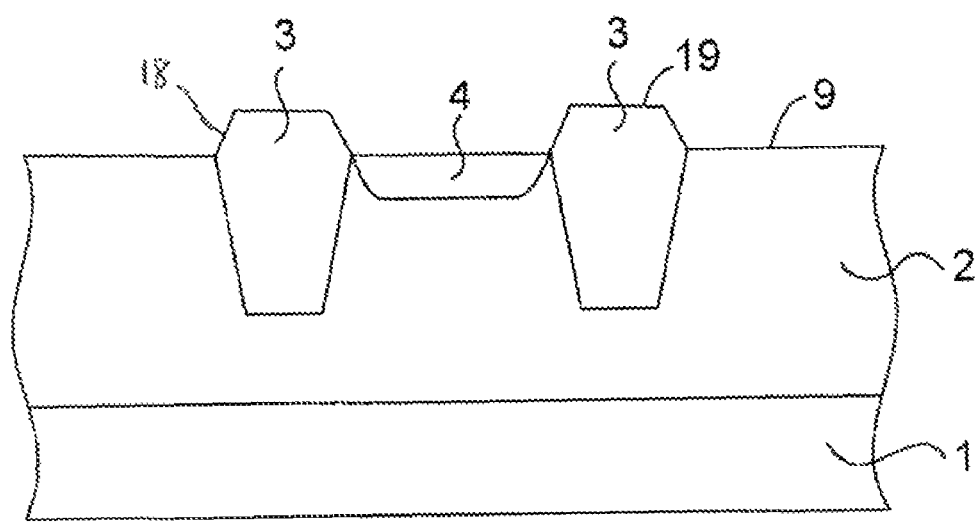
FIGS. 1B, 2B, 3, 4, and 5 are cross-sectional views that depict a fabrication sequence for forming an exemplary protection diode device according to the invention.

Referring to FIGS. 1A and 1B, P-well region 2 is formed in the top portion of semiconductor substrate 1. Semiconductor substrate 1 may be formed of silicon or other suitable materials and in one exemplary embodiment, semiconductor substrate 1 may be a P-type single crystalline silicon with a [100] crystallographic orientation. P-well region 2 may be formed of boron or other suitable P-type material and using conventional methods. P-well region 2 will serve as a bottom component of a protection diode device that is being formed. Shallow trench isolation (STI) structures 3 are formed within P-well region 2 of semiconductor substrate 1 and each include top surface 19 that extends above surface 9 of semiconductor substrate 1. STI structures 3 also include sidewalls 18 that extend above surface 9 of semiconductor substrate 1. Conventional methods may be used to form STI structures 3. STI structures 3 may be formed of silicon dioxide or other dielectric materials. Shallow trench isolation structures 3 may be formed using low pressure chemical vapor deposition (LPCVD) or plasma enhanced chemical vapor deposition (PECVD). Tetraethylorthosilicate (TEOS) may be advantageously used as a silicon oxide source during LPCVD or PECVD operations. N+ region 4 designates a relatively heavily doped N-type region and is formed into a top portion of P-well region 2 and surrounded by STI structures 3 resulting in a protection diode formed of (heavily doped) N+ region 4 and P-well region 2. Conventional patterning methods using photolithography may be used to locate N+ region 4 and conventional ion implantation techniques may be used to introduce to dopant impurities into semiconductor substrate 1 to form N+ region 4. In the exemplary embodiment shown in FIG. 1A, it can be seen that N+ region 4 is surrounded by STI structures 3 which is surrounded, in turn, by the surface portion of P-well region 2 which also extends below N+ region 4 and STI structures 3 as shown in FIG. 1B.

Figure 2A:
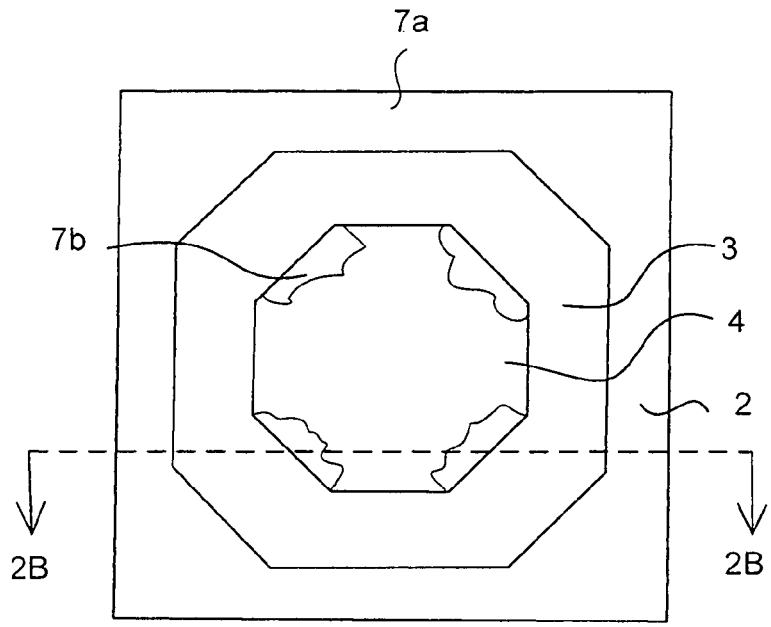
Figure 2B:
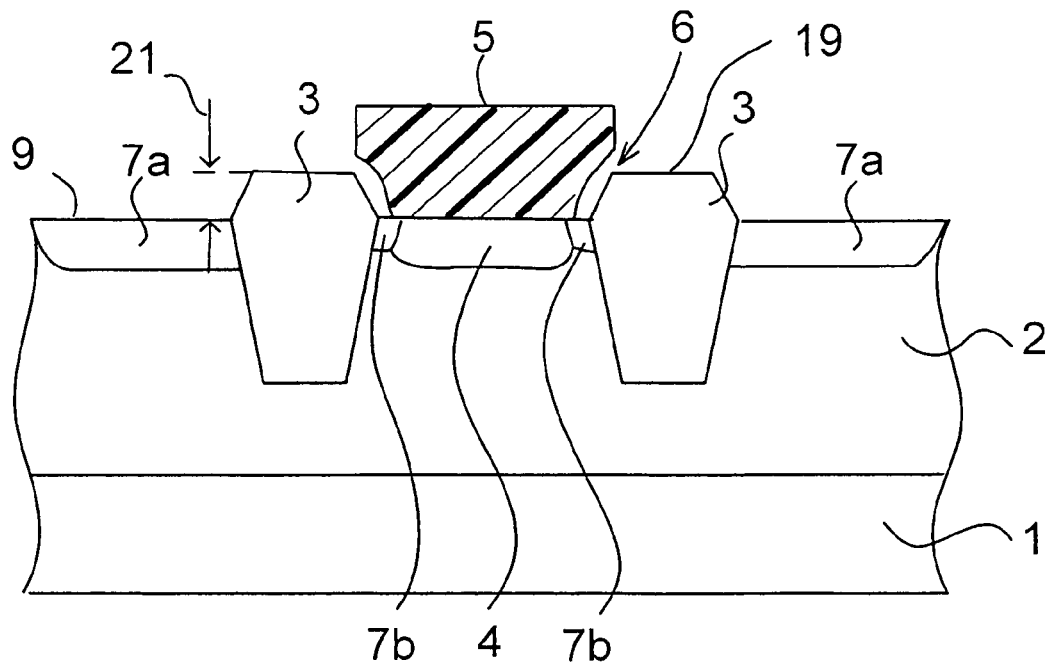

Now turning to FIGS. 2A and 2B, patterned photoresist 5 is formed over $N^+$ region 4 to protect $N^+$ region 4 from being implanted during an impurity introduction operation used to introduce P-type dopant impurities into semiconductor substrate 1 to form $P^+$ regions 7a. $P^+$ regions 7a are relatively heavily doped regions and may be formed using conventional processing operations and using conventional P-type dopant impurities. In an exemplary embodiment, $P^+$ region 7a may be source/drain regions used for transistors formed in various locations of the semiconductor device. In an exemplary embodiment, top surface 19 of STI structure 3 may extend distance 21 above surface 9 of semiconductor substrate 1. Distance 21 may be 500-1000 angstroms in one exemplary embodiment but may be other distances may be used in other exemplary embodiments. Because of the step produced at the edge of STI structure 3 due to this height difference, patterned photoresist 5 inevitably includes notches 6 formed during the photoresist patterning operation. Notches 6 allow the dopant impurity species used to desirably form $P^+$ region 7a, to enter surface 9 and undesirably form $P^+$ regions 7b adjacent STI structure 3 and interposed between STI structure 3 and $N^+$ region 4. The structure including $P^+$ region 7b and P-well region 2 forms a resistor. One consequence of forming undesired $P^+$ regions 7b peripherally about $N^+$ region 4, is a leakage or shorting path that may result from an overlying metal silicide layer that contacts both $P^+$ regions 7b, $N^+$ region 4 and P-well 2 thereby providing a leakage or shorting path to the P-well region and negating the benefit of the protection diode device. If either of $P^+$ regions 7b has a voltage applied to them, leakage will occur resulting in a short to the substrate and the protection diode device will fail. An aspect of the invention prevents such an unwanted voltage from being undesirably applied to $P^+$ regions 7b so that the protection diode does not fail even with the presence of regions 7a.

Figure 3:
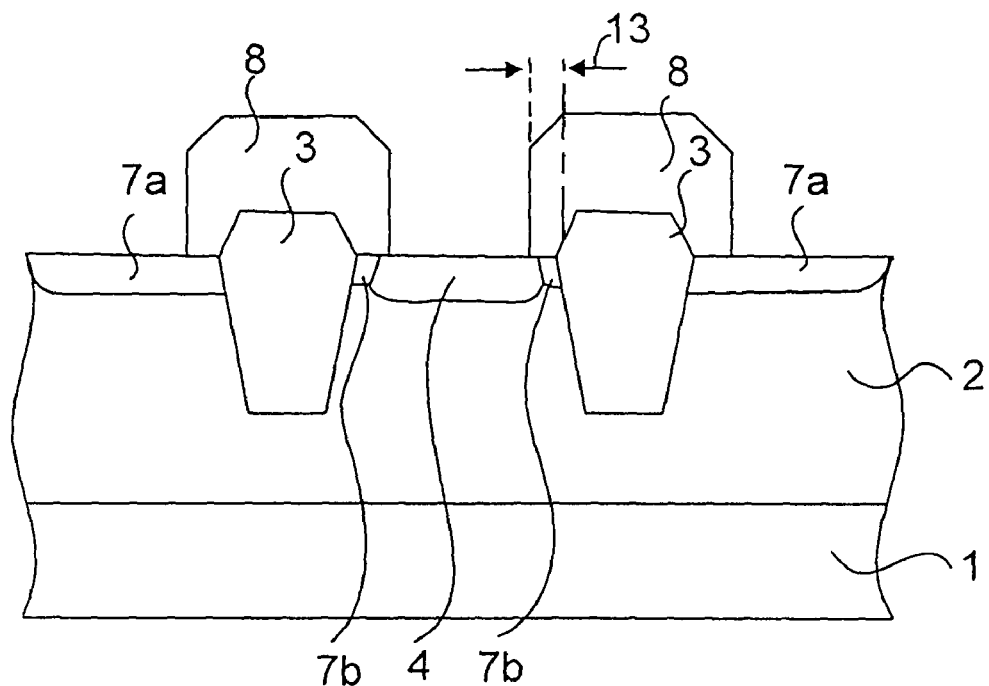

FIG. 3 shows the structure of FIG. 2B after patterned photoresist 5 is removed and block-out structures 8 are formed. Block-out structures 8 are formed over STI structures 3 and extend laterally beyond STI structures 3. In the exemplary embodiment, block-out structures 8 extend distance 13 laterally past STI structures 3. Distance 13 may be at least 1000 angstroms but other distances may be used in other exemplary embodiments. Block-out structures 8 extend over and cover $P^+$ regions 7b. Block-out structure 8 is at least partially formed of a material such as an oxide or other dielectric that is resistant to silicidation. $P^+$ region 7b may be considered a "counterdoped" portion of $N^+$ region 4 since the implantation and doping characteristics are strong enough to form $P^+$ regions out of previously $N^+$-type material. Block-out structure 8 may be silicon oxide formed according to conventional methods. The silicon oxide may already be included in the process sequence for forming the semiconductor device as a resistor protect oxide (RPO) to protect other formed resistor regions from metal silicide formation. The RPO layer may be formed using conventional PECVD or LPCVD procedures and may include a thickness of about 150 to 400 angstroms. In other exemplary embodiments, other dielectrics may be used and in still another exemplary embodiment, polysilicon may be used along with lateral spacers. The polysilicon material may be already included in the processing sequence to form transistor gates or other structures which also include lateral oxide spacers. When block-out structure 8 is formed of polysilicon, oxide spacers are formed along the edges of the polysilicon structure thereby preventing continuity of a formed silicide since an oxide is a silicide resistant material. Block-out layer 8 may be formed using conventional photolithography processes.

Figure 4:
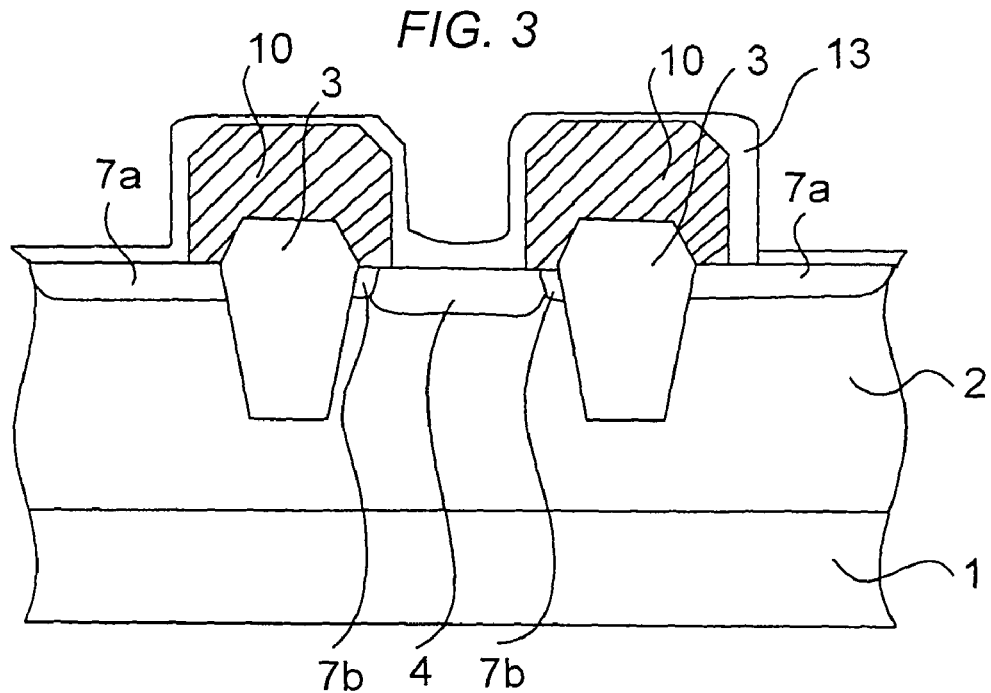
Figure 5:
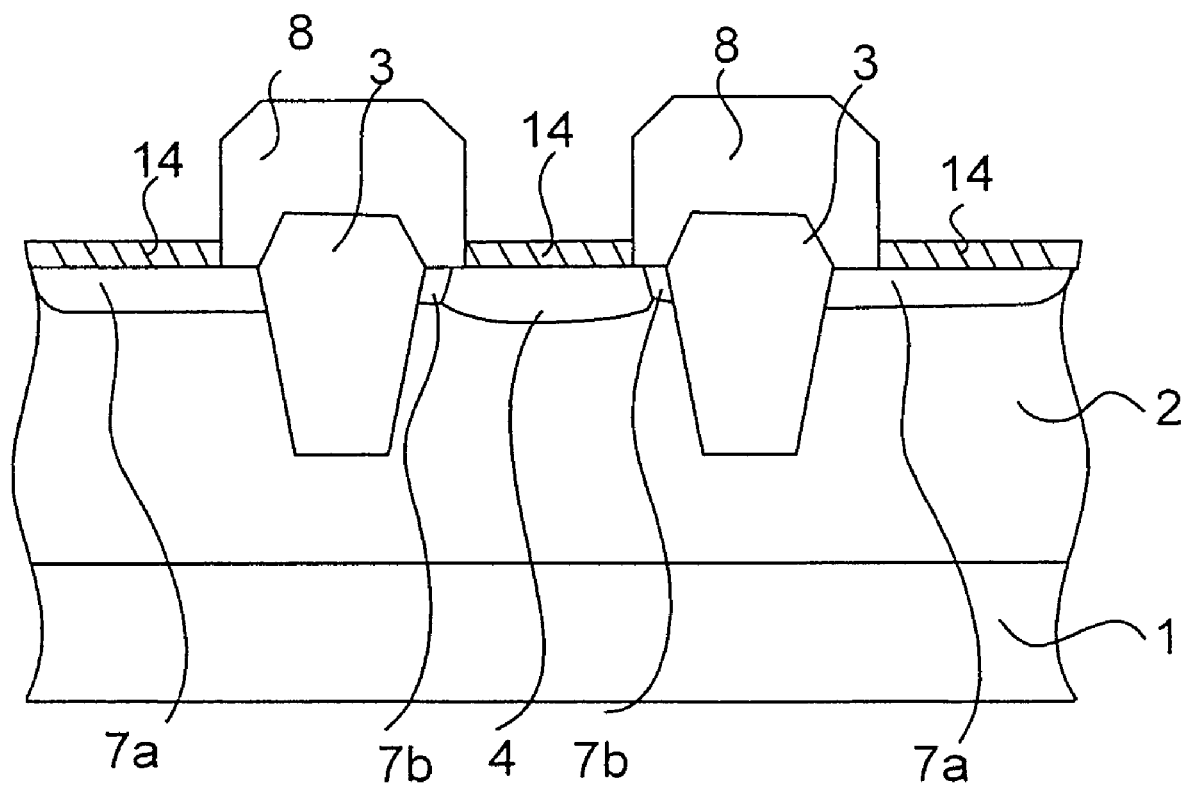

After the formation of block-out structure 8, blanket metal layer 13 such as cobalt, titanium, nickel, or zirconium is formed over the substrate using plasma vapor deposition (PVD) or other suitable procedures and may include an as-deposited thickness ranging from about 70 to 120 angstroms. This is shown in FIG. 4. An annealing process is then employed to convert portions of the metal layer to a silicide film such as silicide film 14 shown in FIG. 5. The silicide film is formed in portions where the deposited metal layer contacts silicon regions. The resulting metal silicide 14 may be cobalt silicide, titanium silicide, nickel silicide or zirconium silicide. Various suitable annealing processes may be used. Conventional furnace annealing or rapid thermal annealing (RTA) may be used. Gases conventionally used for such annealing processes are inert gases such as nitrogen and argon. In areas where metal layer 13 does not contact silicon, and where silicidation does not occur such as over block-out structure 8 when block-out structure 8 is formed of a dielectric, portions of the unreacted metal film 13 are removed using conventional methods such as a liquid chemical solution to form the structure shown in FIG. 5. FIG. 5 includes silicide film 14 and it can be seen that silicide film 14 is advantageously spaced from P+ regions 7b. Silicide layer 14 only overlays N+ region 4 and P+ regions 7a, but not P+ region 7b and therefore does not short P+ region 7b to P-well 2 and thereby maintains the integrity and functionality of the protection diode device.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a protection diode device, comprising:
   forming a well region of a first conductivity type in a top portion of a semiconductor substrate said well region extending downwardly from an upper surface of said semiconductor substrate;
   forming at least one trench isolation structure in said well region, said trench isolation structure extending above said upper surface of said semiconductor substrate;
   forming a first heavily doped region of a second conductivity type in said well region;
   forming a silicide resistant block-out structure covering said trench isolation structure and laterally extending past said trench isolation structure and to a peripheral region of said first heavily doped region adjacent said trench isolation structure; and
   selectively forming a metal silicide layer on an uncovered portion of said first heavily doped region.

2. The method of claim 1, wherein said first conductivity type is P-type, and said second conductivity type is N-type.

3. The method of claim 1, wherein said first conductivity type is N-type, and said second conductivity type is P-type.

4. The method of claim 1, wherein said trench isolation structure extends above said upper surface of said semiconductor substrate by about 500 to 1000 Angstroms.

5. The method of claim 1, wherein said silicide resistant block-out structure is a silicon oxide layer.

6. A method for forming a protection diode device, comprising:
   forming a well region of a first conductivity type in a top portion of a semiconductor substrate;
   forming at least one trench isolation structure in said well region, said trench isolation structure extending above a surface of said well region;
   forming a first heavily doped region of a second conductivity type in said well region;
   forming a silicide resistant block-out structure covering said trench isolation structure and laterally extending to a peripheral region of said first heavily doped region adjacent said trench isolation structure; and
   selectively forming a metal silicide layer on an uncovered portion of said first heavily doped region,
   wherein said silicide resistant block-out structure comprises a polysilicon layer laterally, surrounded by insulating spacers.

7. The method of claim 1, wherein said silicide resistant block-out structure extends laterally beyond said trench isolation structure by at least 1000 Angstroms.

8. The method of claim 1, further comprising forming a second heavily doped region of said first conductivity type in further portions of said well region before said forming a silicide resistant block-out structure.

9. The method of claim 8, wherein said forming a second heavily doped region includes forming a photoresist pattern over said first heavily doped region, then implanting species of said first conductivity type into said further portions.

10. A method for forming a protection diode device, comprising:
    forming a well region of a first conductivity type in a top portion of a semiconductor substrate;
    forming at least one trench isolation structure in said well region, said trench isolation structure extending above a surface of said well region;
    forming a first heavily doped region of a second conductivity type in said well region;
    forming a silicide resistant block-out structure covering said trench isolation structure and laterally extending to a peripheral region of said first heavily doped region adjacent said trench isolation structure; and
    selectively forming a metal silicide layer on an uncovered portion of said first heavily doped region,
    further comprising forming a second heavily doped region of said first conductivity type in further portions of said well region before said forming a silicide resistant block-out structure,
    wherein said forming a second heavily doped region includes forming said second heavily doped region at said peripheral region of said first heavily doped region adjacent said trench isolation structure.

11. The method of claim 4, wherein said trench isolation structure extends above a surface of said well region by about 500 to 1000 angstroms, said surface of said well region comprising said upper surface of said semiconductor substrate.

12. The method of claim 1, wherein said trench isolation structure includes sidewalls above said upper surface of said semiconductor substrate and wherein said forming a silicide resistant block-out structure includes forming said silicide resistant block-out structure along said sidewalls.

13. The method of claim 1, wherein said silicide resistant block-out structure comprises a polysilicon layer laterally surrounded by insulating spacers.

14. The method of claim 8, wherein said forming a second heavily doped region includes forming said second heavily doped region at said peripheral region of said first heavily doped region adjacent said trench isolation structure.

* * * * *